(12) United States Patent
Pleva et al.

(10) Patent No.: US 7,680,464 B2
(45) Date of Patent: Mar. 16, 2010

(54) WAVEGUIDE—PRINTED WIRING BOARD (PWB) INTERCONNECTION

(75) Inventors: Joseph S. Pleva, Londonderry, NH (US); Richard P. Donovan, Windham, NH (US); Stephen P. Leblanc, Stratham, NH (US)

(73) Assignee: Valeo Radar Systems, Inc., Hudson, NH (US)

( * ) Notice: Subject to any disclaimer, the term of this patent is extended or adjusted under 35 U.S.C. 154(b) by 659 days.

(21) Appl. No.: 11/027,523

(22) Filed: Dec. 30, 2004

(65) Prior Publication Data

US 2006/0145778 A1  Jul. 6, 2006

(51) Int. Cl.
*H04B 1/46* (2006.01)
*H01P 1/20* (2006.01)

(52) U.S. Cl. .......................... 455/81; 455/282; 455/328; 333/208; 333/248; 333/254

(58) Field of Classification Search .................. 455/81, 455/328, 282; 333/108, 208, 248, 254; 385/129, 385/132
See application file for complete search history.

(56) References Cited

U.S. PATENT DOCUMENTS

| | | | |
|---|---|---|---|
| 2,540,839 A | | 2/1951 | Southworth |
| 4,286,236 A | | 8/1981 | Fischer |
| 4,322,778 A | * | 3/1982 | Barbour et al. ............. 361/794 |
| 4,534,602 A | * | 8/1985 | Bley ........................... 439/63 |
| 4,771,294 A | * | 9/1988 | Wasilousky ................. 343/853 |
| 5,008,678 A | | 4/1991 | Herman |
| 5,138,436 A | * | 8/1992 | Koepf ........................ 257/728 |
| 5,194,823 A | | 3/1993 | Wendt et al. |
| 5,252,981 A | | 10/1993 | Grein et al. |
| 5,363,075 A | * | 11/1994 | Fanucchi .................... 333/246 |
| 5,414,394 A | * | 5/1995 | Gamand et al. .............. 333/26 |
| 5,451,818 A | * | 9/1995 | Chan et al. .................. 257/728 |
| 5,592,178 A | | 1/1997 | Chang et al. |
| 5,680,080 A | * | 10/1997 | Nishiyama et al. .......... 333/202 |

(Continued)

FOREIGN PATENT DOCUMENTS

EP  1 233 471 A2  8/2002

(Continued)

OTHER PUBLICATIONS

Gao et al.: "Adaptive Linearization Schemes for Weakly Nonlinear Systems Using Adaptive Linear and Nonlinear FIR Filters;" Dept. of Electrical Engineering, University of Toronto; IEEE; Jan. 1991; CH2819-1/90/0000-0009; pp. 9-12.

(Continued)

*Primary Examiner*—Duc M Nguyen
(74) *Attorney, Agent, or Firm*—Daly, Crowley, Mofford & Durkee, LLP

(57) ABSTRACT

An RF interconnection between RF Printed Wiring Boards (PWBs) includes a waveguide transmission line coupled between the RF PWBs. The waveguide feeds are provided as integral parts of each PWB. In one embodiment, the waveguide interconnecting the PWBs is provided as an integral part of a support structure which supports the PWBs. By providing the interconnecting waveguide and the feeds at each end of the waveguide as integral pieces of other already existing structures, a reliable, low cost RF interconnection between RF PWBs having relatively few separate pieces is provided.

17 Claims, 9 Drawing Sheets

U.S. PATENT DOCUMENTS

| | | | |
|---|---|---|---|
| 5,708,433 A | 1/1998 | Craven | |
| 5,727,023 A | 3/1998 | Dent | |
| 5,760,749 A | 6/1998 | Minowa et al. | |
| 5,912,598 A | 6/1999 | Stones et al. | |
| 6,039,580 A | 3/2000 | Sciarretta et al. | |
| 6,137,688 A | 10/2000 | Borkar et al. | |
| 6,167,286 A | 12/2000 | Ward et al. | |
| 6,198,449 B1 | 3/2001 | Muhlhauser et al. | |
| 6,218,987 B1 | 4/2001 | Derneryd et al. | |
| 6,249,242 B1 | 6/2001 | Sekine et al. | |
| 6,265,950 B1* | 7/2001 | Schmidt et al. | 333/26 |
| 6,324,755 B1 | 12/2001 | Borkowski et al. | |
| 6,463,303 B1 | 10/2002 | Zaho | |
| 6,466,101 B2* | 10/2002 | Tanji | 333/34 |
| 6,489,927 B2 | 12/2002 | LeBlanc et al. | |
| 6,492,949 B1 | 12/2002 | Breglia et al. | |
| 6,501,415 B1 | 12/2002 | Viana et al. | |
| 6,577,269 B2 | 6/2003 | Woodington et al. | |
| 6,577,879 B1 | 6/2003 | Hagerman et al. | |
| 6,603,915 B2* | 8/2003 | Glebov et al. | 385/129 |
| 6,614,389 B2 | 9/2003 | Suzuki et al. | |
| 6,642,908 B2 | 11/2003 | Pleva et al. | |
| 6,683,557 B2 | 1/2004 | Pleva et al. | |
| 6,738,017 B2 | 5/2004 | Jacomb-Hood | |
| 6,784,838 B2 | 8/2004 | Howell | |
| 6,794,950 B2* | 9/2004 | du Toit et al. | 333/21 R |
| 6,864,699 B2 | 3/2005 | Sakayori et al. | |
| 6,933,900 B2 | 8/2005 | Kitamori et al. | |
| 6,995,730 B2 | 2/2006 | Pleva et al. | |
| 7,038,608 B1 | 5/2006 | Gilbert | |
| 7,132,905 B2* | 11/2006 | Sano | 333/26 |
| 7,148,766 B2* | 12/2006 | Tong et al. | 333/26 |
| 7,183,995 B2 | 2/2007 | Pleva et al. | |
| 7,212,698 B2* | 5/2007 | Bapst et al. | 385/14 |
| 7,336,141 B2* | 2/2008 | Mueller | 333/26 |
| 7,336,219 B1 | 2/2008 | Lohmeier et al. | |
| 7,345,619 B2 | 3/2008 | Hunt | |
| 7,379,018 B1 | 5/2008 | Lohmeier et al. | |
| 7,400,290 B2 | 7/2008 | Woodington et al. | |
| 7,403,153 B2 | 7/2008 | Kelly, Jr. et al. | |
| 2003/0174479 A1 | 9/2003 | Shimura et al. | |
| 2003/0210179 A1 | 11/2003 | Dizaji et al. | |
| 2004/0027305 A1 | 2/2004 | Pleva et al. | |
| 2004/0119564 A1 | 6/2004 | Itoh et al. | |
| 2004/0164892 A1 | 8/2004 | Shinoda et al. | |
| 2004/0203289 A1 | 10/2004 | Ice et al. | |
| 2004/0208249 A1 | 10/2004 | Risbo et al. | |
| 2006/0125682 A1 | 6/2006 | Kelly, Jr. et al. | |
| 2006/0145778 A1 | 7/2006 | Pleva et al. | |
| 2006/0152406 A1* | 7/2006 | Leblanc et al. | 342/175 |
| 2007/0120731 A1 | 5/2007 | Kelly, Jr. et al. | |
| 2007/0152870 A1 | 7/2007 | Woodington et al. | |
| 2007/0156799 A1 | 7/2007 | Gilbert | |
| 2008/0001809 A1 | 1/2008 | Woodington et al. | |

FOREIGN PATENT DOCUMENTS

| | | |
|---|---|---|
| EP | 1367668 A1 * | 12/2003 |
| EP | 1 804 075 A2 | 7/2007 |
| GB | 2 292 484 A * | 2/1996 |
| GB | 2 381 666 A | 5/2003 |
| GB | 2 413 703 B | 3/2007 |
| WO | WO 2004/044610 A1 | 5/2004 |
| WO | WO 2005/093828 A1 | 10/2005 |

OTHER PUBLICATIONS

Lin et al.; "A High Speed Low-Noise Equalization Technique with Improved Bit Error Rate;" EEE; Jul. 2002; 0-7803-7448; pp. 564-567.

Nordsjo; "An Algorithm for Adaptive Predisortion of Certain Time-Varying Nonlinear High-Power Amplifiers;" 2002 The Institution of Electrical Engineers; XP-002364938; pp. 469-473.

EP Search Report and Written Opinion of the European Patent Office for EP 05 11 1991.5; dated Mar. 2, 2006.

EP Report and Written Opinion of the European Patent Office for EP 05 111 983.2 dated Apr. 7, 2006.

Pleva, et al.; "Beam Architecture For Improving Angular Resolution"; U.S. Appl. No. 11/026,506, filed Dec. 30, 2004.

Gilbert; "Digital to Analog Converter;" U.S. Appl. No. 11/013,950, filed Dec. 16, 2004.

Leblanc et al.; "Vehicle Radar Sensor Assembly"; U.S. Appl. No. 11/323,816, filed Dec. 30, 2005.

Kelly, Jr. et al.; "Method and System for Radar Processing;" U.S. Appl. No. 11/458,126, filed Jul. 18, 2006.

Lohmeier et al.; "System And Method For Generating A Radar Detection Threshold;" U.S. Appl. No. 11/322,684, filed Dec. 30, 2005.

Lohmeier et al.; "System And Method For Verifying A Radar Detection;" U.S. Appl. No. 11/324,073, filed Dec. 30, 2005.

Lohmeier et al.; "Method And System For Generating A Target Alert;" U.S. Appl. No. 11/322,869, filed Dec. 30, 2005.

Woodington, et al.; "Detecting Signal Interference In A Vehicle System"; U.S. Appl. No. 11/427,829, filed Jun. 30, 2006.

Hunt; "Generating Event Signals In A Radar System;" U.S. Appl. No. 11/323,960, filed Dec. 30, 2005.

Gilbert; "Multi-Stage Finite Impulse Response Filter Processing"; U.S. Appl. No. 11/323,459, filed Dec. 30, 2005.

Woodington, et al.; "Multichannel Processing Of Signals In A Radar System"; U.S. Appl. No. 11/323,458, filed Dec. 30, 2005.

Woodington, et al.; "Vehicle Radar Systems Having Multiple Operating Modes"; U.S. Appl. No. 11/324,035, filed Dec. 30, 2005.

Woodington; "Reducing Undesirable Coupling Of Signal(s) Between Two Or More Signal Paths In A Radar System"; U.S. Appl. No. 11/323,982, filed Dec. 30, 2005.

Woodington; "Reducing Undesirable Coupling Of Signal(s) Between Two Or More Signal Paths In A Radar System"; U.S. Appl. No. 11/322,664, filed Dec. 30, 2005.

Cheng; "A Fast Hybrid MoM/FEM Technique for Microstripline Vertical Couplers With Multiple Identical Cavaties;" IEEE Jun. 2003; 0-7803-7846; pp. 1076-1079.

Lohinetong et al.; "Microstrip To Surface Mounted Foam-Based Waveguide Transition For Ka-Band Filter Integration;" IEEE Jun. 2004; 0-7803-8401; pp. 899-902.

Mueller; "SMD-Type 42 GHz Waveguide Filter;" IEEE Jan. 2003; 0-7803-7695; pp. 1089-1092.

EP Search Report and Written Opinion of the European Patent Office for EP 05 11 1994.

EP1 804 075 A3 (w/English Abstract and European Search Report).

Lohinetong et al.: "Microstrip to Surface Mounted Foam-Based Waveguide Transition for Ka-Band Filter Integration;" 2004 4th International Conference on Microwave and Millimeter Wave Technology Proceedings; IEEE vol. 1; Oct. 11, 2004; ISBN: 978-0-7803-8401-9; pp. 899-902.

Picard et al.; "LTCC Transition and Embedded Bandpass Filter for LMDS Applications;" 2004 Microwave Conference; IEEE vol. 1; Oct. 11, 2004; ISBN: 978-1-58053-992-0; pp. 389-392.

PCT Search Report of the ISA for PCT/US2007/088063 dated Apr. 28, 2008.

Written Opinion of the ISA for PCT/US2007/088063 dated Apr. 28, 2008.

* cited by examiner

WAVEGUIDE—PRINTED WIRING BOARD (PWB) INTERCONNECTION

CROSS-REFERENCE TO RELATED APPLICATIONS

Not applicable.

STATEMENTS REGARDING FEDERALLY SPONSORED RESEARCH

Not applicable.

FIELD OF THE INVENTION

This invention relates generally to radio frequency (RF) interconnection techniques and more particularly to techniques and structures for transmitting RF signals between printed wiring boards (PWBs).

BACKGROUND OF THE INVENTION

As is known in the art, in some applications it is necessary to couple radio frequency (RF) signals between multiple printed wiring boards (PWBs). Such connections are often made by using either a coaxial cable or a printed shielded RF conductor circuit (also referred to as a flex circuit). Both of these techniques are troubled by implementation complexity, reliability concerns, as well as cost issues.

A coaxial cable connection typically requires the mounting of a connecting pin on the PWB. The coaxial cable shield is stripped to expose a section of a center conductor which is then soldered to the connecting pin. This is done through a cover assembly, which is typically provided as a two-piece assembly, to provide a required level of isolation between different circuit portions. Although this type of connection results in a relatively high level of performance, it is a relatively complicated assembly requiring precision parts.

A multi-layer flex circuit PWB interconnection can be implemented by soldering a center conductor from a flex-print circuit to a signal path on a PWB. Although this approach has fewer parts, the flex-print circuit is relatively expensive because of the need to include ground planes and via holes to achieve desired isolation levels. Furthermore, it is relatively difficult to obtain a good electrical seal around a flex circuit and this makes it difficult to achieve a desired level of isolation between the PWBs being connected through the flex circuit. More, in high frequency applications, the losses through this type of structure can be relatively high.

SUMMARY OF THE INVENTION

In accordance with the present invention, an RF interconnection between first and second radio frequency (RF) Printed Wiring Boards (PWBs) includes a transmission line having first and second opposing ends and first and second feed circuits coupled to respective ones of the first and second ends of the transmission line. The first feed is provided as an integral part of at least a portion of the first PWB and the second feed is provided as an integral part of at least a portion of the second PWB.

With this particular arrangement, a low cost and reliable signal path suitable for use between a plurality of RF Printed Wiring Boards (PWBs) is provided. In one embodiment, the transmission line is provided as a waveguide transmission line and the first and second feed circuits are provided as waveguide feed circuits. By providing the feed circuits as integral portions of the PWBs, the feed circuits can be provided as part of the circuit layouts for each the PWB's. Thus, no additional connecting hardware is needed to couple the PWBs to the transmission line. Moreover, the signal path is suitable to couple RF signals between each of the PWBs. In the case where the transmission line is provided as an RF transmission line, the RF feed circuits can be provided as printed circuits (e.g. patch radiator feed circuits) on part of the PWBs. Alternatively, the RF feed circuits can be provided as edge launch waveguides coupled to the PWBs or as launch pins projecting from a surface of the PWBs. Alternatively still, the RF feed circuits can be provided from coaxial line PWB transmission lines.

In accordance with a further aspect of the present invention, a radio frequency (RF) assembly includes a printed wiring board (PWB) frame having a waveguide portion included as an integral part thereof. The waveguide portion of the frame has a first waveguide aperture exposed on a first side of the PWB frame at a first end of the waveguide and a second waveguide port aperture exposed on the first side of the PWB frame at a second end of the waveguide.

With this particular arrangement, an RF assembly having a PWB frame which supports multiple PWBs and which includes at least a portion of an integral RF waveguide signal path is provided. The PWBs include integral feed circuits used to couple RF signals between the waveguide portion of the frame and the PWBs. Other PWBs disposed on the frame can form all or some of top or side portions of the waveguide signal path. If PWB frame and the PWBs are already part of an existing module and assembly process, the module can be made less expensively and more reliably via inclusion of the integrated waveguide—PWB interconnection in the existing frame and PWB parts.

In one embodiment, the waveguide must be conductively attached (via an epoxy, a solder connection or a pressure contact) to the PWB's and in the case where a conductive region of a PWB forms a wall of the integral waveguide portion, the conductive region must be attached to the integral waveguide portion. By providing the waveguide and feeds as integral portions of the frame and the PWBs being disposed in the frame, respectively, the part count for the interconnection is reduced.

In accordance with a still further aspect of the present invention, a radio frequency (RF) assembly includes a printed wiring board (PWB) frame having a waveguide portion included as an integral part of the PWB frame. The waveguide portion has a first waveguide port aperture exposed on a first side of the PWB frame at a first end of the waveguide and a second waveguide port aperture exposed on the first side of the PWB frame at a second end of the waveguide. The RF assembly further includes a first PWB disposed on a first region on the first side of the PWB frame and a second PWB disposed on a second region on the first side of the PWB frame. Waveguide feed circuits provided as integral parts of the first and second PWBs are used to couple signals between the PWBs and the waveguide.

With this particular arrangement, an RF assembly having an RF signal path between multiple PWBs or between two different locations on a single PWB is provided. By providing the waveguide portion as an integral part of the PWB frame RF and providing the feed circuits as an integral part of the PWBs, the RF signal path has a relatively small impact on the overall cost of the RF assembly. The PWBs on which the feed circuits are integrated can be provided as any type of PWB (e.g. soft substrate, LTCC, etc) and the frame can be provided from any material suitable to support the PWBs including but not limited to metal, plastic and composite materials.

The PWB frame also includes alignment posts and surfaces to aid in properly aligning the PWBs in the frame. This approach helps ensure consistent RF performance by ensuring that the RF feed circuits on the PWBs are properly aligned with desired regions (i.e. waveguide port regions) of the integrated waveguide.

The integrated RF signal path can benefit any application in which space is limited and where it is desired to transmit high frequency signals between two PWBs or between two locations on a single PWB. Such an integrated RF signal path finds use in a number of automotive radar applications including but not limited to blind spot detection, lane change, park slot measurement, cross-traffic warning, pre-crash, parking aid (including both front and back-up) and autonomous cruise control (ACC). In these applications the separation of transmit and receive functions (e.g. isolation between transmit and received signals) is important to performance and thus it is desirable to use separate PWBs for transmit and receive functions. However, RF signals must still be transmitted between the separate PWBs.

In some systems it is desirable to separate transmit and receive boards to reduce (or in some cases even minimize) leakage signals between transmit and receive antennas. Separating PWBs (e.g. transmit and received PWBs) and transit and receive antennas reduces leakage signals between the antennas and PWBs and allows automotive radar sensors and other systems to have improved sensitivity, improved near range performance as well as a simple and consistent threshold setting and higher production throughput. Thus, this technique allows automotive radar sensors to achieve a relatively high level of performance.

Since the RF interconnections and related techniques described herein are reliable and cost effective, it is possible to separate transmit and receive PWBs in a radar system without significantly increasing system cost and complexity. Moreover, the integrated RF signal path described herein provides a reliable RF signal path between PWBs with relatively little, if any, added cost in parts or assembly. Thus, this approach reduces cost without reducing system reliability.

BRIEF DESCRIPTION OF THE DRAWINGS

The foregoing features of this invention, as well as the invention itself, may be more fully understood from the following description of the drawings in which.

DETAILED DESCRIPTION

Figure 1:
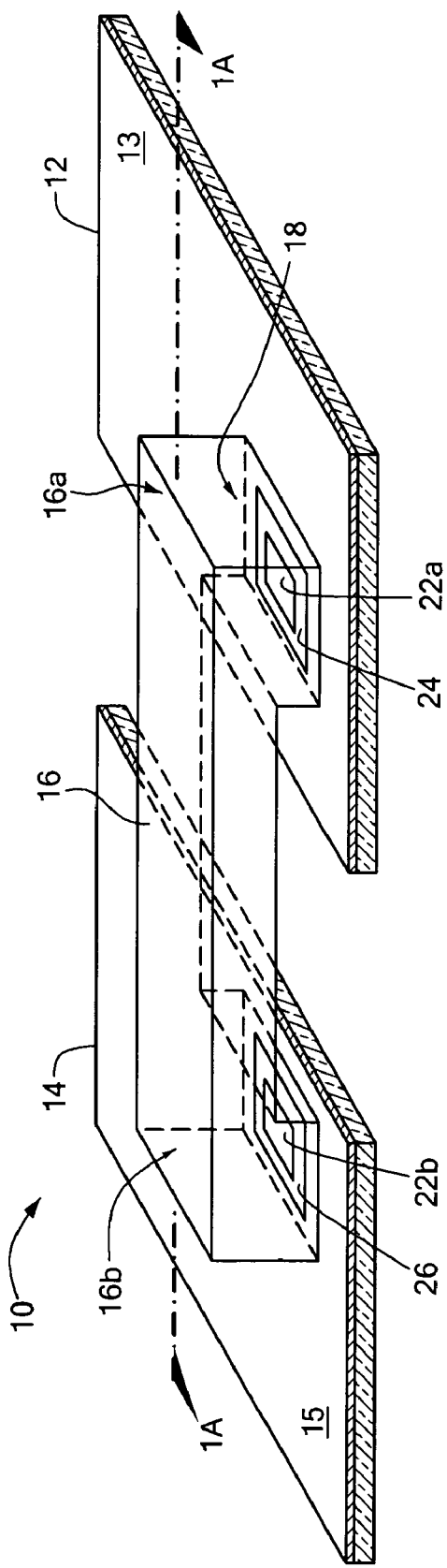
FIG. 1 is an isometric view of two printed wiring boards (PWBs) having a waveguide radio frequency (RF) interconnect therebetween.
Figure 1A:
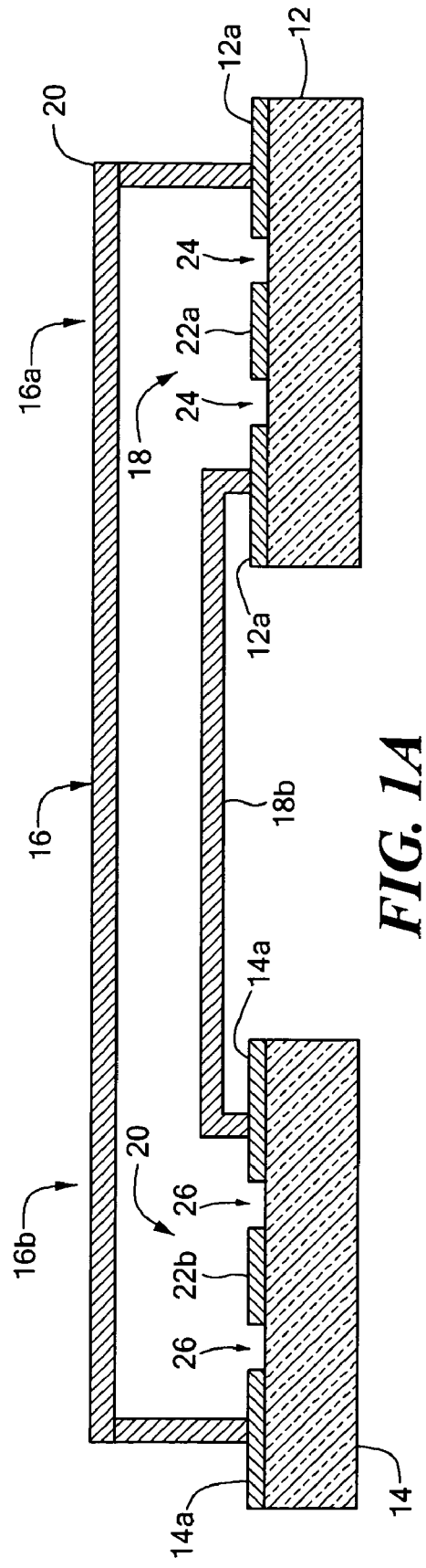
FIG. 1A is a cross-sectional view of a the RF interconnect shown in FIG. 1 taken across lines 1A-1A in FIG. 1.

Referring now to FIGS. 1 and 1A in which like elements are provided having like reference designations, an RF interconnection 10 between first and second radio frequency (RF) Printed Wiring Boards (PWBs) 12, 14 (also sometimes referred to as printed circuit boards or PCBs) includes a waveguide transmission line 16 having first and second ends 16a, 16b (also referred to as waveguide port apertures or more simply waveguide ports) and pair of waveguide feed circuits 18, 20 disposed to launch signals into and couple signals out of the transmission line 16 at ends 16a, 16b, respectively.

The feed circuits 18, 20 are each provided as an integral part of at least a portion of the PWBs 12, 14 respectively. In the exemplary embodiment shown in FIGS. 1 and 1A, the feed circuits 18, 20 are provided as radiating elements and in particular are provided as micro-strip (or so-called "patch") antenna elements on PWB surfaces 12a, 14a. Each patch is provided from a conductive region 22a, 22b separated from PWB ground planes 13, 15 by dielectric regions 24, 26.

Each end 16a, 16b of the waveguide 16 must be conductively attached to the ground planes 13, 15 of the respective PWB's 12, 14. The waveguide 16 can be attached to the PWBs via a conductive epoxy, via a solder connection, via a pressure contact or by any other means now or later known to those of ordinary skill in the art.

By using a waveguide section for the transmission line and incorporating the waveguide feeds into each PWB, an RF interconnect between two PWBs which is reliable and cost-effective is provided. Since the waveguide feeds 18, 20 are incorporated into each PWB, separate connecting structures are not needed on each of the PWB's and the RF interconnect is provided having fewer parts than other RF interconnect techniques. Moreover, as will become evident from the description provided hereinbelow, since the waveguide 16 can be constructed in many different ways, the waveguide could easily be incorporated into a PWB support structure or package, essentially reducing the part count of the RF interconnect to zero.

The particular size, shape, transmission and other characteristics of the waveguide will depend upon a variety of factors including but not limited to the frequency of operation and the type of PWB's being connected. For example, the size of the waveguide opening could be different for each PWB due to differences in dielectric constants of the PWB materials; the waveguide may be filled with dielectric to reduce the size for lower frequency operation or and the waveguide can be provided as so-called ridged waveguide for use in relatively broad band applications.

Likewise, the particular type of feed to use in any application will depend upon a variety of factors including but not limited to the PWB type and construction as well as the frequency band in which the feed must operate and the bandwidth requirements. While the exemplary embodiment, of FIGS. 1 and 1A illustrate the feed structure as a microstrip antenna element, in other embodiments, it may be desirable or necessary to provide the feed structure as a stacked patch antenna element (e.g. if an application requires a relatively wide frequency bandwidth). A stacked patch can be provided, for example, by incorporating the stacked patch feed in the PWB design or by adding into the waveguide a foam insert having a parasitic patch on one side thereof and arranging the insert above a patch on the PWB (such as patch 22a) to provide a stacked patch structure.

It should be appreciated that any radiator design may be used as a feed for the waveguide structure. The feed (particularly when provided as a printed circuit radiator) may be provided having any desired shape including but not limited to a rectangular shape, a square shape, an oval shape, a round shape, a cross shape a polygonal shape or even an irregular shape. The particular type and shape of the feed will be selected in accordance the needs of the particular application and in accordance with a variety of factors including but not limited to the type of transmission line being used, the size and shape of the transmission line and the amount of space available on the PWB for the feed.

Figure 2:
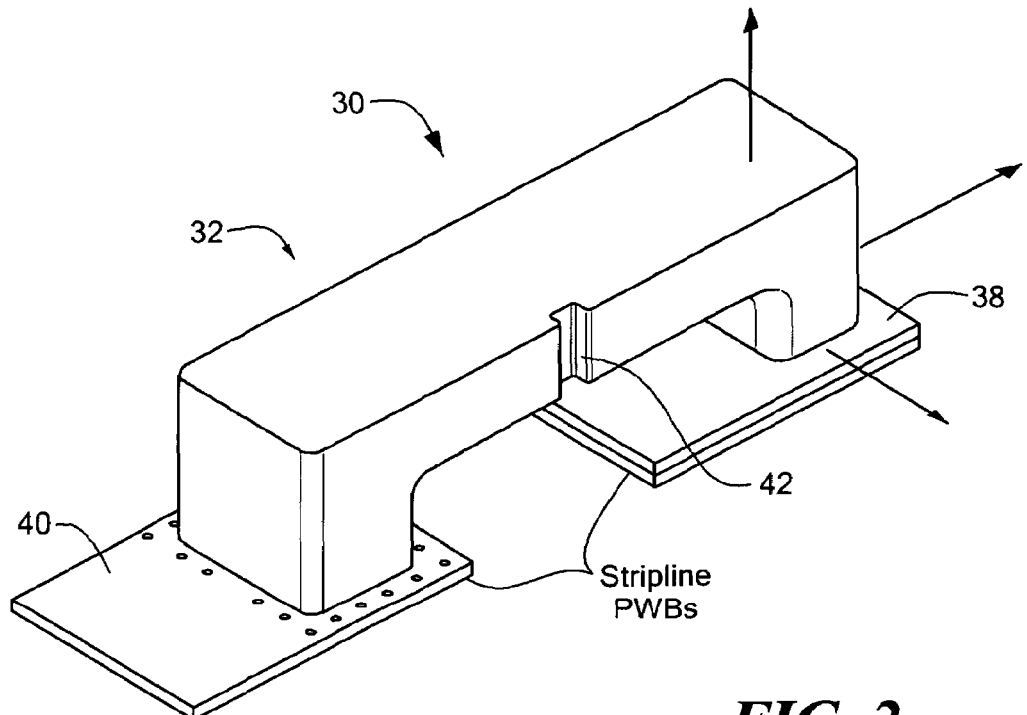
FIG. 2 is an isometric view of a waveguide RF interconnect having a tuning structure.
Figure 2A:
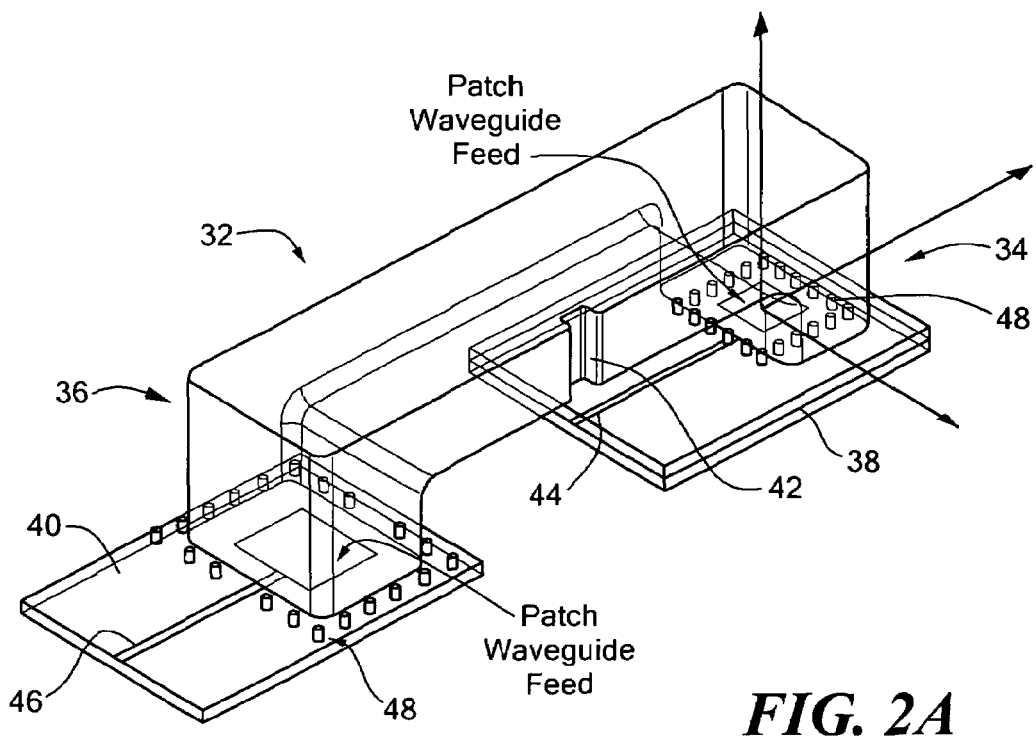
FIG. 2A is an isometric view of the waveguide RF interconnect of FIG. 2 with the waveguide shown in phantom.

Referring now to FIGS. 2 and 2A in which like elements are provided having like reference designations, an RF interconnection 30 includes a waveguide transmission line portion 32 (or more simply a "waveguide 32") and associated feed structures 34, 36 (visible in FIG. 2A) through which RF signals are coupled between a pair of PWBs 38, 40 (only portions of the PWBs 38, 40 being shown in FIGS. 2 and 2A for clarity). The waveguide transmission line portion 32 and associated feed structures 34, 36 (FIG. 2A) may be similar to the RF interconnection and associated feed structures described above in conjunction with FIGS. 1 and 1A.

The waveguide is provided having a tuning structure 42 disposed in a wall thereof. The tuning structure 42 is selected having a size and shape which improves the impedance match between the waveguide ports and the feed structures. In the exemplary embodiment of FIG. 2, the tuning structure 42 is provided as a notch 42 in a sidewall of the waveguide 32. The particular size, shape and location of the notch can be determined using empirical techniques to provide a desired impedance match between the waveguide 32 and the feed structures 34, 36 on the PWBs 38, 40.

It should be appreciated that the PWBs 38, 40 may be provided from different materials. For example, PWBs 38, 40 may be provided from materials having different electrical properties such as relative dielectric constants, and also having different structural characteristics such as board thicknesses. In one embodiment, one PWB is provided from a so-called soft substrate material (e.g. polytetrafluoroethylene (PTFE)/woven glass or combinations thereof) having a relative dielectric constant of about 3.02 while the other PWB is provided from a so-called thick film substrate (e.g. low temperature co-fired ceramic—LTCC) having a relative dielectric constant of about 7.4.

This difference in PWB characteristics results in a different waveguide opening for each PWB which results in an inherent mismatch within the waveguide. Thus, to compensate for this mismatch between the openings, the waveguide is provided having a tuning structure 42.

Although the tuning structure 42 is here shown as a single protrusion or post in a single waveguide wall, other types of tuning structures may also be used to "tune" or provide a desired impedance match between the waveguide and one or both of the feed structures. For example, multiple posts, openings, broadwall curtains, narrow wall curtains, steps or any combination thereof may be provided in one or more internal surfaces of the waveguide walls. Alternatively, conductive elements (e.g. probes) or dielectric elements may be inserted into the waveguide. Alternatively still, one or more tuning elements may be provided as part of the PWBs 38, 40 (e.g. tuning circuits may be printed, etched or otherwise provided on one or both of the PWBs. It should also be appreciated that more than one tuning structure may be used. For example, separate tuning structures may be provided on the waveguide to match each waveguide port to the field structure.

Thus, it should be appreciated that the RF interconnect can be modified to accommodate any type or combination of PWB interconnection and any such modifications are considered to be within the scope of what is covered by the claims.

Referring now to FIG. 2A, the waveguide is shown in phantom to reveal the feed structures 34, 36. As can be seen, the feed structures are each provided as integral portions of the PWBs' 38, 40 and in particular, the feed structures are provided as patch radiators disposed in the waveguide apertures. The patch radiators couple signals to and from the waveguide through the apertures.

Strip transmission lines 44, 46 couple RF signals between the patch radiators and other circuits (since only a portion of each of the PWBs 38, 40 are shown in FIG. 2A, no other circuits are visible in FIG. 2A). A plurality of via holes generally denoted 48 are disposed about each of the patch radiators to provide a cavity for the patch and a barrier to any leakage signals from the feed structures 34, 36.

It should be appreciated that the waveguide structures described above in conjunction with FIGS. 1-2A are stand alone structures and are separate from the PCBs themselves. The feed circuits (e.g. feed circuits 22a, 22b in FIGS. 1 and 1A), however are provided as integral parts of the PCBs.

Figure 3:
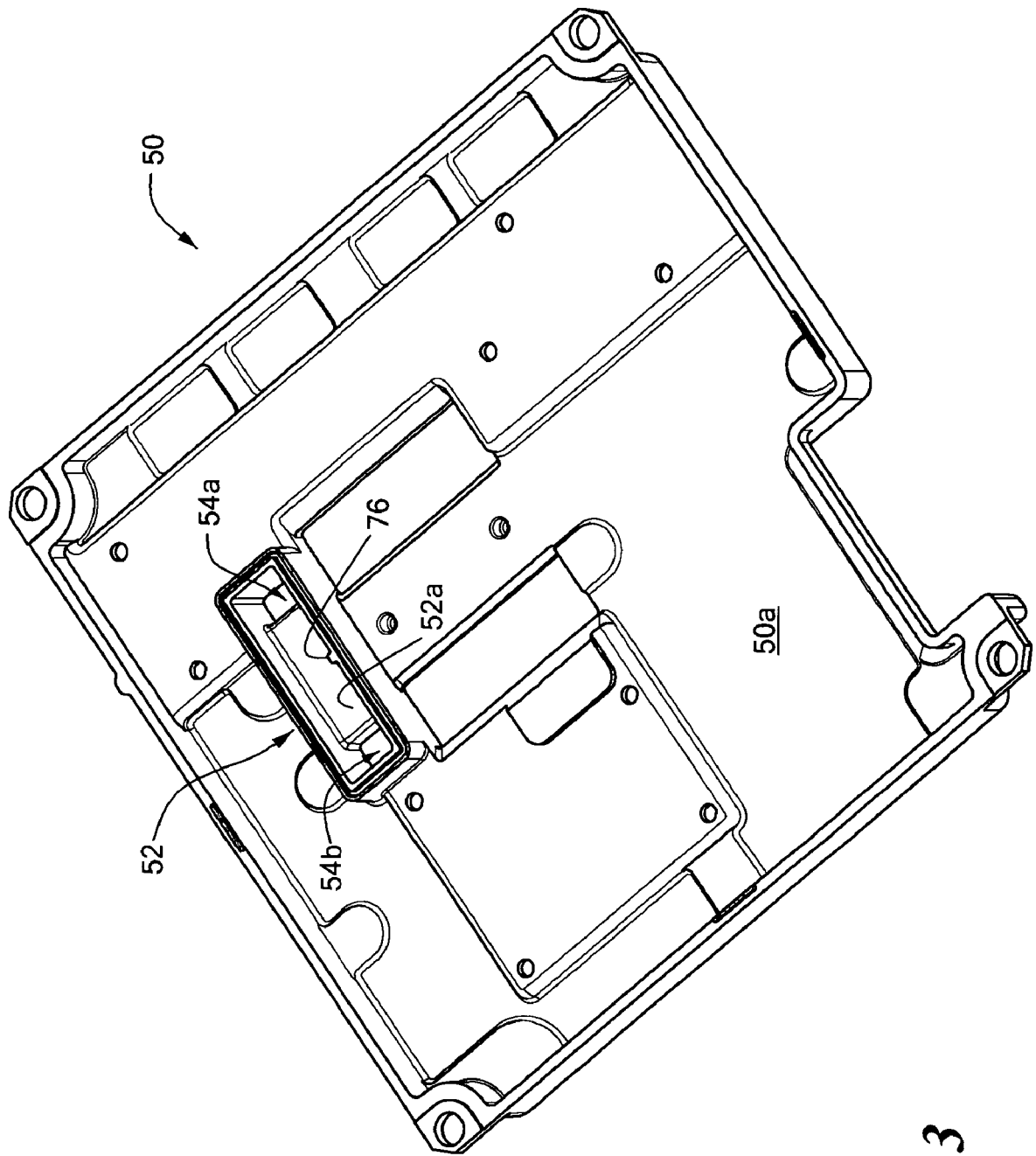
FIG. 3 is an isometric top view of a PWB support frame having an integral waveguide.
Figure 3A:
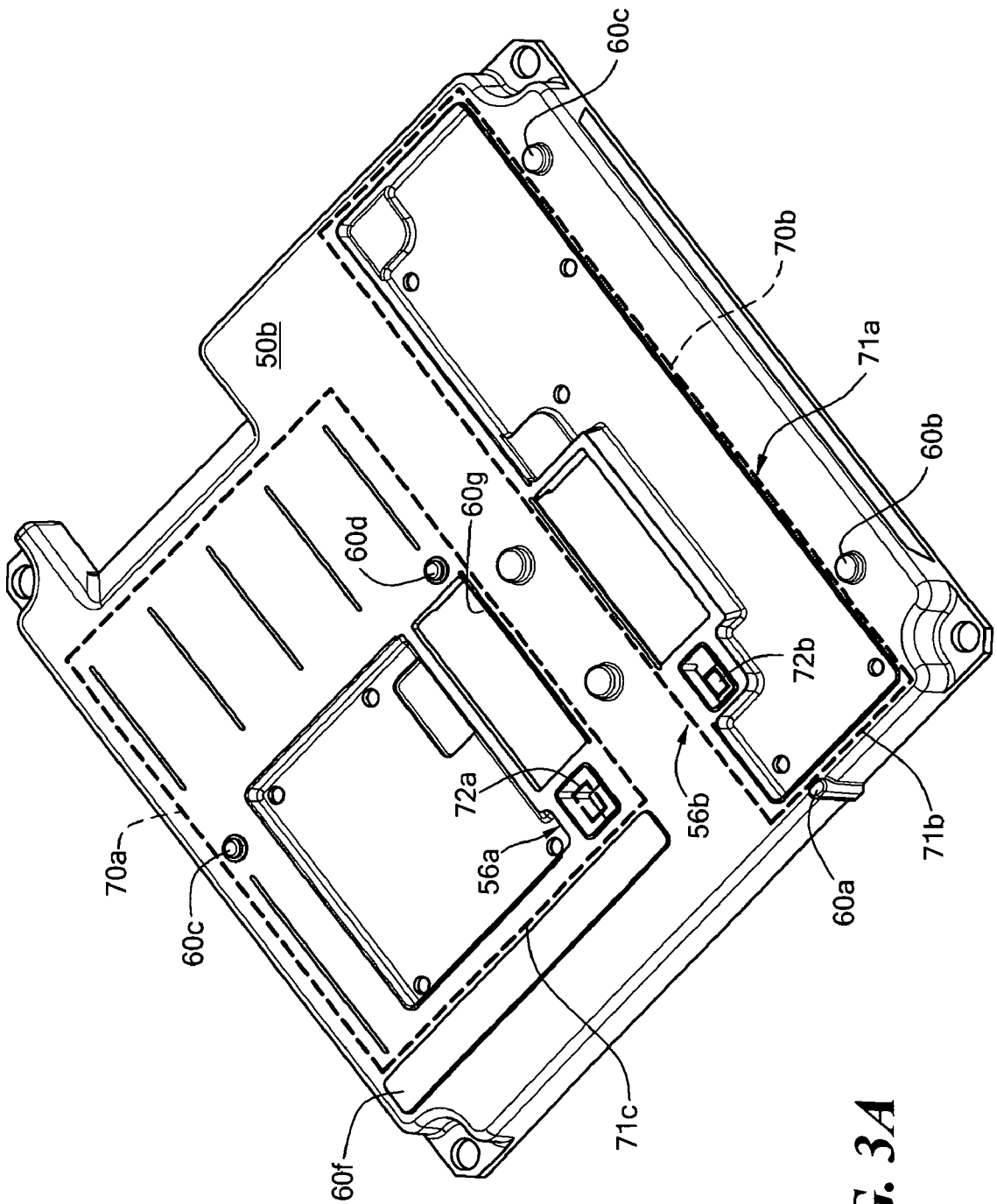
FIG. 3A is an isometric bottom view of the PWB support frame shown in FIG. 3.
Figure 3B:
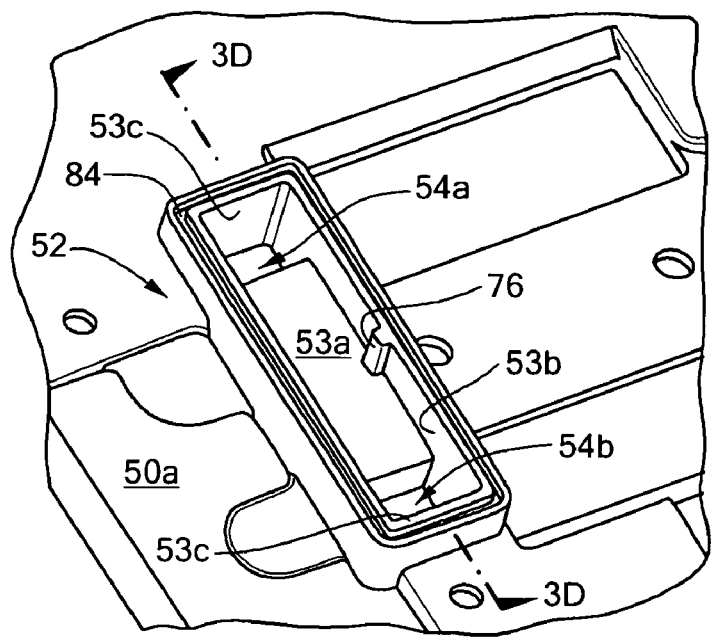
FIG. 3B is an enlarged view of the integral waveguide shown in FIG. 3.
Figure 3C:
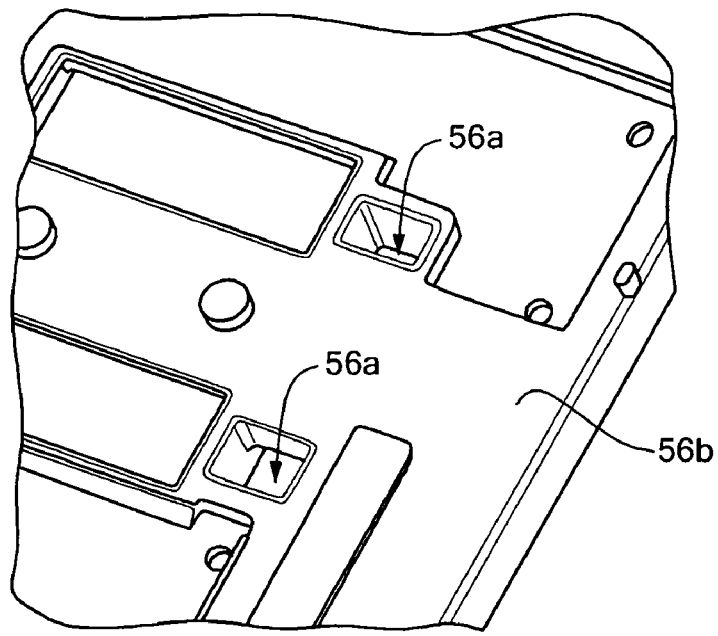
FIG. 3C is an enlarged view of the waveguide opening apertures shown in FIG. 3A.
Figure 3D:
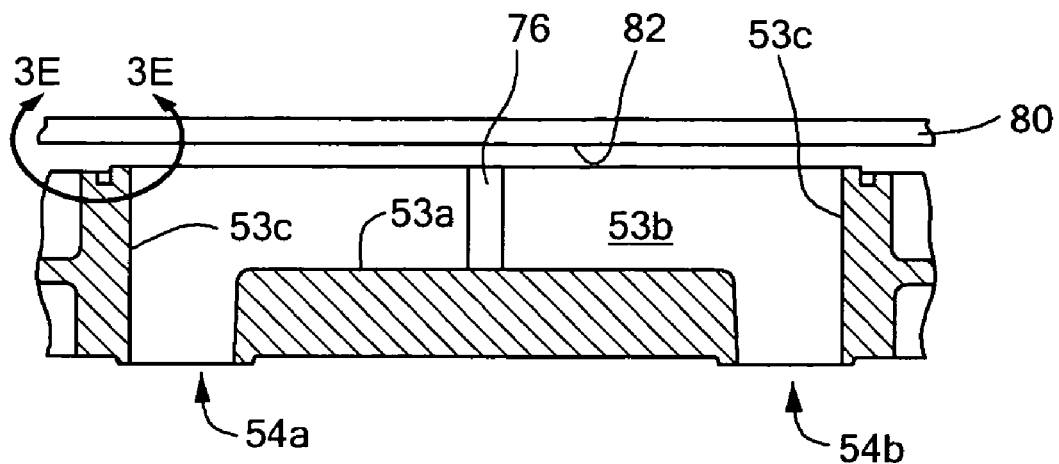
FIG. 3D is a cross-sectional view of the integral waveguide on the PWB support frame taken across lines 3D-3D of FIG. 3B.
Figure 3E:
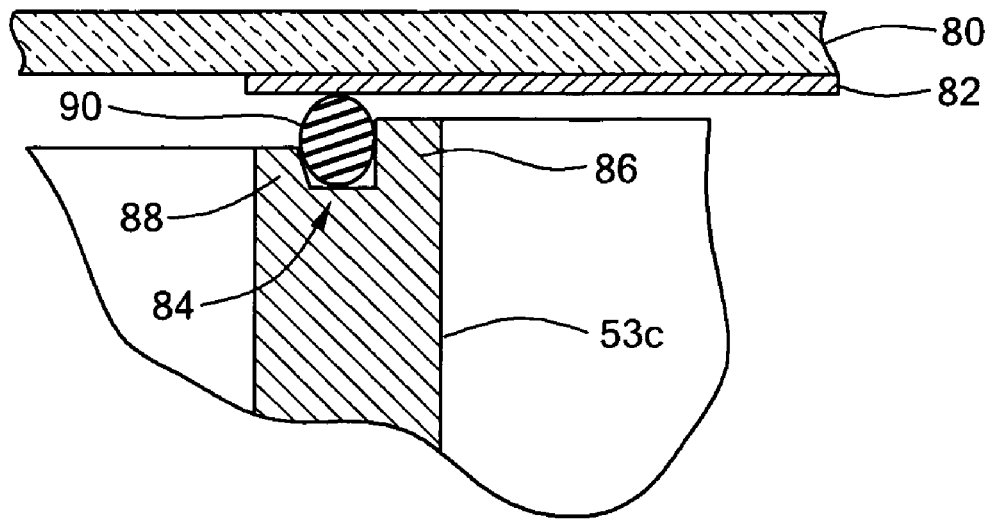
FIG. 3E is an enlarged view of a portion of the waveguide taken across lines 3E-3E of FIG. 3D.

Referring now to FIGS. 3-3E, in which like elements are provided having like reference designations throughout the several views, a PWB frame 50 adapted to hold one or more PWBs is provided having first and second opposing sides 50a, 50b (FIG. 3A). Wall regions 52 project from a surface of side 50a and form a bottom wall 53a (FIG. 3B), sidewalls 53b (FIG. 3B), endwalls 53c (FIG. 3B) and first and second openings 54a, 54b which lead to waveguide port apertures 56a, 56b (FIG. 3C) of a waveguide 53. It should be appreciated that the waveguide 53 is not fully formed in the frame 50 as one side of the waveguide (in this case an E-plane wall opposite wall 53a) is not formed as part of the waveguide structure in the frame 50 as doing so would complicate the frame fabrication process. The waveguide wall could, however, be provided as a separate piece part (e.g. a cover or plate) which is coupled to the remaining waveguide portions by bonding, press-in, solder, welding, or any other technique well known to those of ordinary skill in the art.

As can be most clearly seen in FIG. 3C, the first and second waveguide port apertures 56a, 56b of the waveguide portion 53 of the frame are exposed on a surface of a second side 50b of the PWB frame 50 at first and second ends of the waveguide portion 52.

The frame 50 may be provided from any suitable material including but not limited to metal, plastic, or any other material suitable to support PWB's disposed on the frame. In the case where the frame is provided from a nonconductive material, those portions of the frame corresponding the internal waveguide walls must be coated or otherwise provided with a conductive layer or material.

The frame 50 can be fabricated using molding or any other fabrication techniques known to those of ordinary skill in the art and with which the waveguide 53 can be provided as an integral part of the frame 50. That is, ideally, the waveguide 53 is provided in the frame without the use of additional parts or additional assembly steps.

It should be appreciated that in this particular embodiment, the waveguide openings 54a, 54b and apertures 56a, 56b are neither the same size nor the same shape. Although the openings 54a, 54b may be the same shape in some embodiments, in general, the size and shape of each waveguide opening 54a, 54b and aperture aperture 56a, 56b is selected to provide a suitable impedance match between the waveguide 53 and the respective feed circuits.

Two PWBs 70a, 70b shown in phantom in FIG. 3A, are disposed on side 50b of the PWB frame 50. The PWBs are provided having feed circuits 72a, 72b (also shown in phantom in FIG. 3A) disposed on surfaces of the PWBs and located such that when the PWBs 70a, 70b are properly located on side 50b of PWB 50, the feed circuits 72a, 72b are aligned with the waveguide openings 54a, 54b to couple signals between the PWBs 70a, 70b and the waveguide ports 54a, 54b. It should be appreciated that any type of alignment or locating structure may be used to ensure that the PWBs 70a, 70b are properly aligned in the frame 50.

As shown in FIG. 3A, in this exemplary embodiment, a plurality of alignment posts 60a-60e and alignment surfaces 60f, 60g project from a surface of side 50b and are used to ensure proper alignment of the PWBs 70a, 70b on the PWB frame 50. In particular, sides 71a, 71b of PWB 70b are in contact with alignment posts 60a-60c. In this manner, feed circuit 72b is properly aligned in the aperture 56a A pair of tooling holes 60d, 60e and surfaces 60f, 60g are used to align PWB 70a in the PWB frame to thus ensure that feed circuit 72a is properly aligned in the aperture 56b. In particular, holes in the PWB 70a are aligned with the holes 60d, 60e and posts enter both the PWB holes and the PWB frame holes 60d, 60e to align the PWB 70a on the PWB frame. The posts may project from the holes 60d, 60e or the PWB holes may be aligned with the holes 60d, 60e and the posts put in place to maintain the alignment. It should be appreciated, of course, that other features could be added to the waveguide openings and PWBs to provide alignment. In general any alignment technique known to those of ordinary skill in the art can be used to align the waveguide feed with the waveguide opening.

The waveguide 53 is provided having a tuning structure 76 (FIG. 3B) formed as a part of the waveguide wall 53b. In this particular embodiment, the tuning structure is provided as a post or protrusion which can be molded or otherwise provided as part of the sidewall 53b during a process for molding or otherwise providing the waveguide.

As shown in FIG. 3A, the waveguide is provided as an integral part of the PWB frame 50 and the feed structures 72a, 72b are provided as an integral part of the PWBs 70a, 70b. Thus, the entire waveguide-PWB interconnection is provided without the use of additional parts. That is, no parts separate from the frame 50 or PWBs 70a, 70b are required to provide the waveguide-PWB interconnection.

Referring now to FIG. 3D, an expanded cross-sectional view of the integrated waveguide portion 53 of the PWB frame taken across lines 3D-3D in FIG. 3B is shown. When the waveguide is molded as part of the PWB frame, the bottom wall 53a, two sidewalls 53b and two end walls 53c are formed. The top wall (i.e. the wall directly opposite the bottom wall 53a) of the waveguide, however, is not formed since forming the top wall would complicate the mold process. Rather, the top of the waveguide is left open and a top must be placed over the walls 53b, 53c to close the waveguide and thus make it a functional waveguide transmission line.

To that end, a PWB 80 having a conductive region 82 provided thereon is disposed over the open portion of the waveguide 53 and the conductive region 82 forms the fourth side of the waveguide 53. Other conductive tops not provided as part of a PWB may also be used to form the final waveguide wall.

Referring now to FIG. 3E, an expanded cross-sectional view of a portion of the integrated waveguide structure taken across lines 3D-3D in FIG. 3D is shown. A channel 84 is formed in the waveguide wall. An inner wall portion 86 is provided having a height which is greater than an outer wall portion 88. A material 90 is disposed in the channel 80 to secure the conductive region 82 and/or provide a conductive seal between the conductive region 82 and the waveguide sidewalls 53b and endwalls 53c. The material 90 may be provided, for example, as a conductive epoxy 90. Other materials, including but not limited to conductive gaskets, conductive silicones, and crushable wire mesh may, of course, also be used. Alternatively still, the top wall of the waveguide may be provided having a knife-edge shape and a waveguide cover made of a material softer than the edge can be pressed or otherwise forced onto the knife edge of the waveguide wall.

It should be appreciated that in FIG. 3E, a space (or gap) is shown between the conductive region 82 and a top surface of the wall 86. This space is provided only for clarity in describing the drawings and to illustrate the shape of the conductive epoxy 90 shortly before the conductive region 82 is placed tightly against the top surface of the wall 86. In practice, no gap will exist between conductive surface 82 and the top surface of the waveguide wall 86 against which the surface of the conductive region 82 is disposed.

The material 90 is placed in the channel 84 and when the conductive portion of the cover is disposed over the waveguide, the cover pushes against and compresses the material 90. Since the inner wall 86 of the channel wall 84 is higher than the outer wall 88 of the channel wall 84, any excess material flows to the outside of the waveguide rather than toward the inside of the waveguide.

It should be appreciated that the waveguide portion can be constructed in many different ways. For example, it may be possible to form the integral waveguide 53 in the frame 50 such that a side wall of the waveguide (i.e. an H-plane wall in the waveguide) is omitted rather than an E-plane wall. Alternatively, it may be desirable to form the integral waveguide such that a split occurs down the center of an E-plane wall of the waveguide. This may be desirable since the concentration of electrical currents in that waveguide location are relatively weak (this assumes, of course, a waveguide having a rectangular cross-sectional shape and signals propagating within the waveguide in the dominant TE waveguide mode). If other waveguide shapes or modes are used, then it may be preferable to split the waveguide in a different location based upon ease of manufacture and electrical performance characteristics. After reading the description provided herein, one of ordinary skill in the art will understand how to select a waveguide configuration for a particular application while incorporating the waveguide into the PWB or into the PWB support package (i.e. PWB frame) in a manner which eliminates the number of additional parts needed to provide PWB interconnect (i.e. no additional parts needed to provide the interconnect structure).

Figure 4:
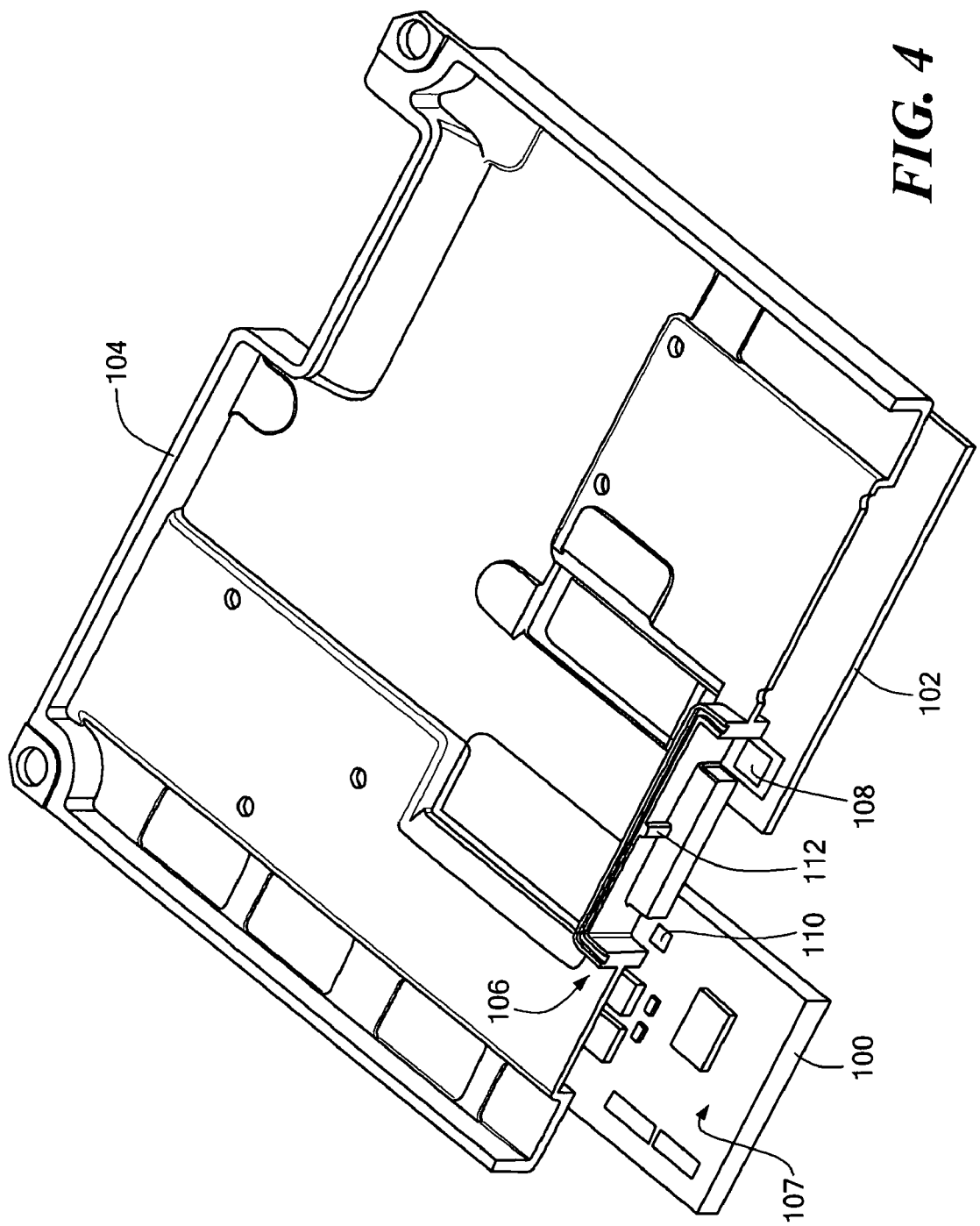
FIG. 4 is an isometric view of two RF PWBs mounted to a PWB support frame.

Referring now to FIG. 4, a pair of PWBs 100, 102 are disposed in a PWB frame 104. The PWB frame 104 has provided as an integral part thereof a waveguide structure 106 which forms a portion of an RF interconnection through which RF signals can be coupled between the two RF PWB boards 100, 102. It should be appreciated that to provide clarity in the drawings and the written description, only portions of the PWBs 100, 102, frame 104 and waveguide 106 are shown in FIG. 4.

A plurality of electrical components generally denoted 107 are disposed on the PWB 100. Each of the PWBs 100, 102 is provided having patch waveguide feeds 108, 110. The feeds 108, 100 provide the excitation for the waveguide structure at each PWB interface (i.e. where the waveguide apertures abut surfaces of the PWBs 100, 102). The patch feed circuits 108, 110 are each provided as printed circuits on the PWBs 100, 102. Thus, the patch feed circuits 108, 110 are each provided as integral parts of the respective PWBs 100, 102.

It should be appreciated that in this exemplary embodiment, the two RF PWBs are of completely different construction. One PWB is provided from a so-called soft substrate material (e.g. polytetrafluoroethylene (PTFE), woven glass or combinations thereof) having a relative dielectric constant of about 3.02 while the other PWB is provided from a so-called thick film substrate (e.g. low temperature co-fired ceramic—LTCC) having a relative dielectric constant of about 7.4.

This difference in PWB characteristics results in a different waveguide opening for each PWB which results in an inherent mismatch within the waveguide. A protrusion 112 in the waveguide wall compensates for this mismatch between the openings. Thus, it should be appreciated that the RF interconnect can be modified to accommodate any type or combination of PWB interconnection and any such modifications are considered to be within the scope of what is covered by the claims.

The RF interconnection is between the two RF PWB's 100, 102. A third PWB (not shown in FIG. 4) includes a printed conductive portion such that when it is disposed on the PWB frame, the conductive portion of the third PWB becomes the cover for the open portion of the waveguide. Thus the waveguide cover can be provided as an integral part of a third PWB. Other types of covers which are not integral with a PWB, may of course, also be used and attached to the waveguide using any one of a variety of techniques including but not limited to bonding, soldering, brazing, welding and press-in techniques.

The two RF PWB boards 100, 102 can be bonded to the support structure 104, using conductive epoxy. Other fastening or attachment techniques may of course also be used. The attachment of the waveguide openings to the PWBs 100, 102 is preferably included as part of the process of bonding the PWBs to the frame.

As explained above, the cover for the waveguide may be provided as a conductive region on a third PWB and in this case, the cover can be attached in a similar fashion when the third PWB is similarly bonded to the frame to complete the assembly. It should be appreciated that the third PWB may be provided as a PWB on which digital circuitry is provided. That is, the third PWB can be provided as a non-RF PWB.

Significantly, the interconnecting waveguide 106 is incorporated into the design of the PWB support structure 104 and is not a separate part. Also, the waveguide cover and the waveguide feeds 108, 110 are all included as integral portions of the circuit layouts for each of three PWB's. Thus, the waveguide-PWB interconnect is provided without using any additional parts. Furthermore, since the waveguide-PWB interconnect assembly process is included as part of the RF module assembly process, no process steps have been added to assemble the waveguide interconnection. Thus, since the waveguide, covers, feeds, and assembly are all included as part of an existing assembly and process, this normally troublesome and costly RF interconnection is realized with nearly no added cost.

Figure 5:
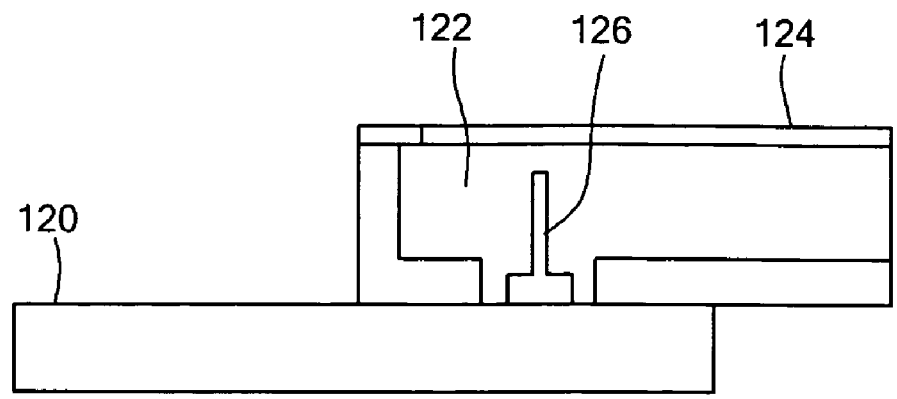
FIG. 5 is a cross-sectional side view of a pin feed for a waveguide RF interconnect coupled to a PWB.

Referring now to FIG. 5, an RF circuit includes a PWB 120 having a waveguide 122 disposed thereon. The waveguide is provided having a cover 124. The waveguide 122 may be provided as an integral portion of a PWB frame. A feed 126 for the waveguide is provided using a launch pin 126. Thus, the structure of FIG. 5 may be similar the structure described above in conjunction with FIGS. 1-4 with the exception being that the feed is provided from a pin 126 rather than as a printed circuit. The advantage to this design is that the feed design has a minimum impact on the PWB design. However, the waveguide will take up more surface area on the PWB in this configuration and there is the added cost of the pin and its assembly on the PWB.

Figure 6:
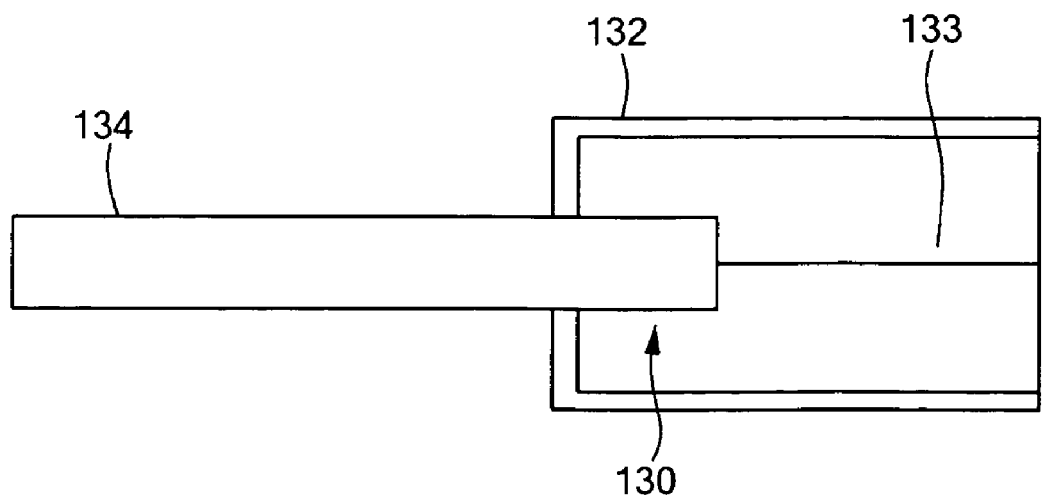
FIG. 6 is a cross-sectional side view of an edge launch waveguide coupled to a PWB.

Referring now to FIG. 6, an alternative waveguide configuration is shown. This configuration has an end launch feed 130 into a waveguide 132 which is split (denoted as 133) along the E-wall (broad dimension) of the waveguide 132. The advantage of splitting the waveguide 132 this way is that it reduces the impact of the seam 133 on waveguide performance. The feed 130 for the waveguide is also incorporated into the design of the PWB 134. However, the design would impact the entire thickness of the PWB 134, whereas the techniques described above only requires the top layers for the feed design. Also, the edge of the PWB 134 becomes a critical dimension since it would be necessary to maintain relatively small tolerances to ensure proper mating with between the waveguide and the feed and it is relatively difficult (and thus expensive) using present state of the art manufacturing techniques to maintain thickness variations of a multi-layer PWB to 10% or less. Moreover, this technique requires at least two parts. One part (e.g. the bottom half waveguide) can be incorporated into the support design as describe previously, but the other part (e.g. the top half waveguide) would need to be a separate part.

Figure 7:
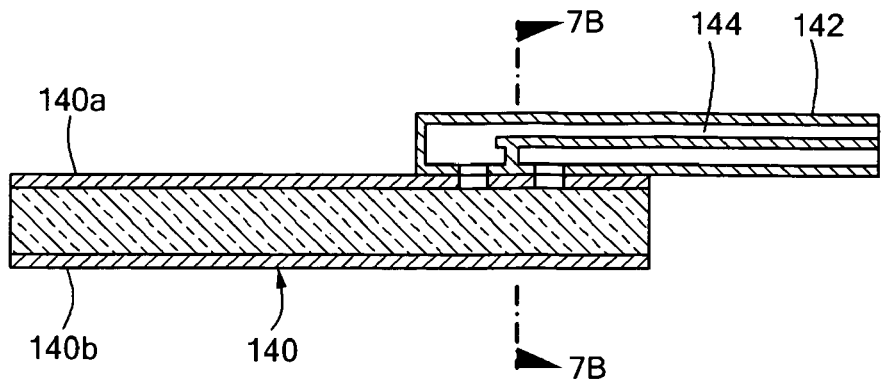
FIG. 7 is a is a cross-sectional side view of a PWB RF interconnect.
Figure 7A:
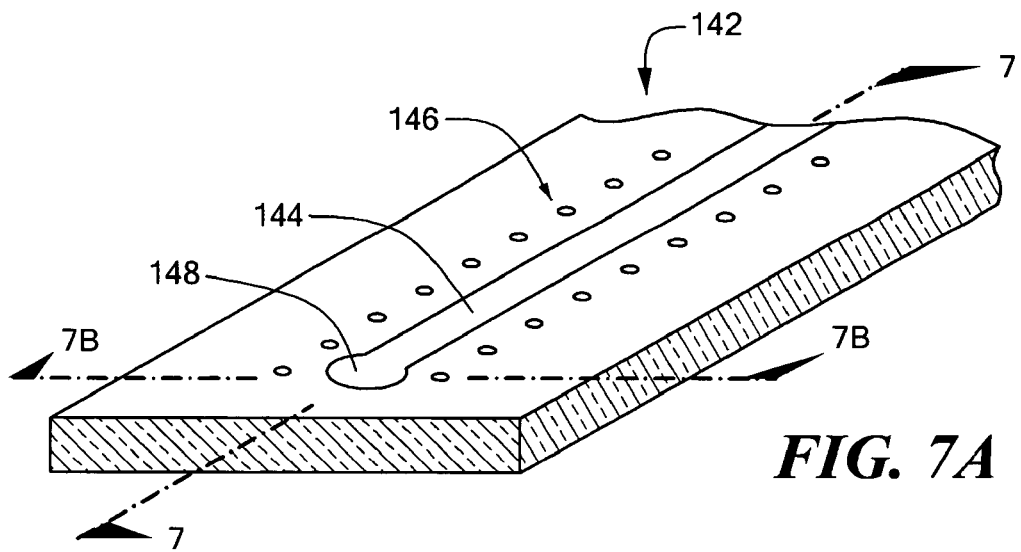
FIG. 7A is an isometric view of a portion of the PWB RF interconnect shown in FIG. 7.
Figure 7B:
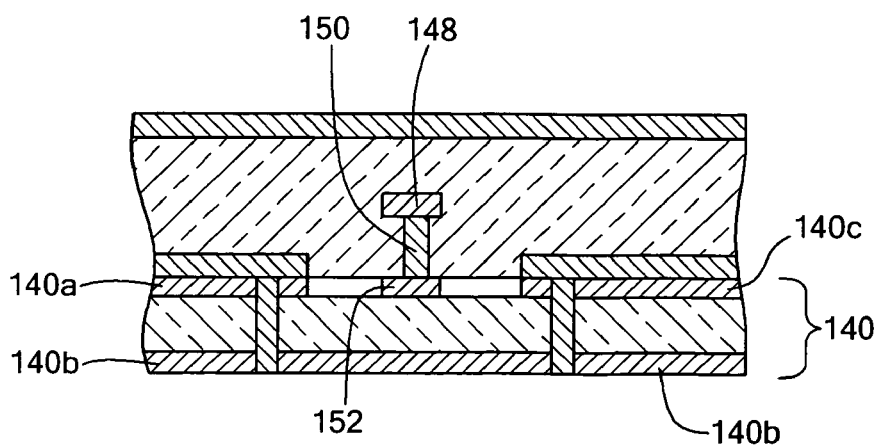
FIG. 7B is a cross-sectional view of a portion of the PWB RF interconnect shown in FIG. 7.

Referring now to FIGS. 7-7B, in which like elements are provided having like reference designations throughout the several views, an RF interconnect is provided by connect a PWB 140 having first and second ground planes 140*a*, 140*b* with a coaxial PWB interconnection 142 having a center conductor 144. The center conductor 144 is coupled to a conductor on the PWB 140. A series of plated through holes 146 provides a shield around the conductor 144. An electrical connection 150 is made through a pad 148 on the conductor 144 to a conductor 152 on the PWB 140. In this manner, a RF connection is provided between the PWB 140 and the coaxial PWB interconnection 142. A second PWB (nor visible in FIGS. 7-7B) is coupled to the other end of the coaxial PWB interconnection 142.

This approach has the advantage of simple assembly and the performance of a coaxial connection. The disadvantage is in the significant added cost of the PWB 142.

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims. All publications and references cited herein are expressly incorporated herein by reference in their entirety.

What is claimed is:

1. A radio frequency (RF) assembly for providing an RE signal path between first and second RF printed wiring boards (PWBs), the RF assembly comprising:

a PWB frame having first and second opposing surfaces and having a portion of a waveguide formed therein, said waveguide portion having a first waveguide port at a first end thereof and having a second waveguide port at a second end thereof, said PWB frame configured to hold the first and second PWBs on the first surface thereof and to hold a third PWB on the second surface thereof such that when the third PWB is disposed on said PWB frame, the waveguide portion becomes a functional waveguide transmission line;

a first waveguide feed disposed on the first PWB, such that when said first PWB is disposed on the first side of said PWB frame, said first waveguide feed is coupled to a first one of the first and second waveguide ports; and a second waveguide feed disposed on the second PWB such that when said second PWB is disposed on the first side of said PWB frame, said second waveguide feed coupled to a second one of the first and second waveguide ports.

2. The RE assembly of claim 1 wherein said first waveguide feed comprises a radiating element provided as a printed circuit.

3. The RE assembly of claim 2 wherein said radiating element corresponds to a patch antenna radiating element.

4. The RF assembly of claim 1 wherein the first port of said waveguide is provided having a size which is not the same as the size of the second port of said waveguide.

5. The RF assembly of claim 1 wherein the first end of said waveguide is provided having a shape which is not the same as the shape in the second end of said waveguide.

6. An RE assembly comprising a printed wiring board (PWB) frame having first and second opposing surfaces and having a wall projecting from the second surface of said PWB frame which forms a waveguide portion, said waveguide portion having a first waveguide port aperture exposed on the first surface of the PWB frame at a first end of said waveguide and having a second waveguide port aperture exposed on the first surface of the PWB frame at a second end of said waveguide wherein each of said waveguide ports are adapted for coupling to a feed circuit provided on one or more PWBs disposed on the first surface of said PWB frame and wherein said PWB frame is configured such that the waveguide portion becomes a functional waveguide transmission line when a PWB is disposed on the second surface of said PWB frame.

7. The RF assembly of claim 6 further comprising a first plurality of PWB alignment structures projecting from the first surface of the PWB frame.

8. The RE assembly of claim 6 further comprising a first region on the first surface of the PWB frame adapted to accept a first PWB and a second region on the first surface of the PWB frame adapted to support a second PWB.

9. A radio frequency (RE) assembly comprising:
a printed wiring board (PWB) frame having first and second opposing surfaces and a waveguide portion, said waveguide portion having a first waveguide port exposed on the first surface of the PWB frame at a first end of said waveguide portion and having a second waveguide port exposed on the first surface of the PWB frame at a second end of said waveguide portion wherein each of said waveguide ports are adapted for coupling to a feed circuit provided on a surface of one or more PWBs to be disposed on the first surface of said PWB frame and wherein said PWB frame is configured such that the waveguide portion is provided having an opening in a wall thereof, with the opening being exposed on the second surface of said PWB frame.

10. The RF assembly of claim 9 further comprising:
a first PWB disposed on a first region on the first surface of the PWB frame;
a second PWB disposed on a second region on the first surface of the PWB frame;
a first waveguide feed provided as an integral part of at least a portion of said first PWB, said first waveguide feed coupled to a first one of the first and second waveguide ports; and
a second waveguide feed provided as an integral part of at least a portion of said second PWB, said second waveguide feed coupled to a second one of the first and second waveguide ports.

11. The RF assembly of claim 10 further comprising:
a third PWB having a conductive portion, said third PWB disposed on a first region of the second surface of said PWB frame and aligned on said PWB frame such that a conductive portion of said third PWB covers the opening in the waveguide portion of said PWB frame.

12. The RF assembly of claim 10 wherein said waveguide feed comprises at least one of:
a printed circuit provided as part of said first PWB;
an edge launch waveguide coupled to a PWB
a launch pin projecting from a first surface of said first PWB; and
a coaxial line PWB transmission line.

13. The RF assembly of claim 9 wherein said waveguide portion of said PWB frame includes two sidewalls, two end walls and a bottom wall.

14. The RF assembly of claim 13 wherein said waveguide portion of said PWB frame is split along an E-plan wall of said waveguide.

15. The RF assembly of claim 13 wherein the bottom wall of said waveguide portion of said PWB frame corresponds to an E-plan wall.

16. The RF assembly of claim 13 wherein the bottom wall of said waveguide portion of said PWB frame corresponds to an E-plan wall and the assembly further comprises a cover disposed over the open side of said waveguide portion wherein said cover corresponds to a top wall of said waveguide portion of said PWB frame.

17. The RF assembly of claim 16 wherein said cover is provided as a conductive portion of a third PWB, said third PWB disposed over a second side of said PWB frame.

* * * * *